United States Patent [19]

Sudo et al.

[11] Patent Number: 4,470,872
[45] Date of Patent: Sep. 11, 1984

[54] PREVENTING SIDE-ETCHING BY ADHERING AN OVERHANG MASK TO THE SIDEWALL WITH ADHESIVE

[75] Inventors: Michio Sudo, Kuki; Hitoshi Miura, Tatebayashi, both of Japan

[73] Assignee: Kangyo Denkikiki Kabushiki Kaisha, Tokyo, Japan

[21] Appl. No.: 495,911

[22] Filed: May 18, 1983

[30] Foreign Application Priority Data

May 24, 1982 [JP] Japan .................................. 57-87705

[51] Int. Cl.³ ......................................... H01L 21/308
[52] U.S. Cl. .................................... 156/630; 156/633; 156/651; 156/659.1; 156/901; 156/904; 430/314; 430/316
[58] Field of Search ............ 156/631, 633, 651, 659.1, 156/661.1, 901, 904, 630; 430/314, 316

[56] References Cited

U.S. PATENT DOCUMENTS

| | | | |
|---|---|---|---|
| 3,006,796 | 10/1961 | Bridwell | 156/904 |
| 3,544,401 | 12/1970 | Jarman | 156/651 |
| 4,293,377 | 10/1981 | Miyajima | 156/659.1 |
| 4,354,897 | 10/1982 | Nakajima | 156/659.1 |

FOREIGN PATENT DOCUMENTS

| | | | |
|---|---|---|---|
| 12603 | 4/1972 | Japan | 156/659.1 |
| 77848 | 10/1978 | Japan | 156/659.1 |
| 70835 | 5/1980 | Japan | 430/316 |

OTHER PUBLICATIONS

Elijah et al., "Etching . . . Undercutting", IBM Technical Disclosure Bulletin, vol. 14, No. 9 (2/72) p. 2607.

*Primary Examiner*—Jerome W. Massie
*Attorney, Agent, or Firm*—Pollock, Vande Sande and Priddy

[57] ABSTRACT

A metal member to be etched is subjected to chemical etching through a mask having a predetermined pattern whereafter that portion of the mask overhanging a side-etched portion resulting from the etching is bent down to be joined by an adhesive binder to the side wall of the side-etched portion to form an etching-resistant layer on the side wall. Then the metal member is subjected again to etching through the etching-resistant layer and the mask.

11 Claims, 17 Drawing Figures

PREVENTING SIDE-ETCHING BY ADHERING AN OVERHANG MASK TO THE SIDEWALL WITH ADHESIVE

BACKGROUND OF THE INVENTION

The present invention relates to a chemical etching method which is applicable, for instance, to the manufacture of printed circuits.

Sometimes a spiral coil is produced by forming, through chemical etching, fine conductor leads on an insulating film e.g. conductor leads 30 μm to several mm wide and 10 to 200 μm thick with a spacing 0.6 to 1.5 times larger than the thickness as set forth, for example, in U.S. Pat. No. 4,340,833 "Miniature Motor Coil" issued on July 20, 1982. That is to say, fine conductor leads sometimes are formed by chemical etching with a spacing substantially equal to the thickness of the conductor layer. In chemical etching under such conditions and with close dimensional tolerances one encounters the problem of what is called side etching. More particularly, in forming a pattern of required shape by chemical etching, an etching-resistant mask layer of a pattern corresponding to the required shape is formed on a member to be etched and an etchant is supplied to the portional areas of the member not covered with the mask layer for etching. If the etching were effected only in a direction perpendicular to the surface of the member to be etched, the pattern of the required shape would be obtained but, in practice, as the etching proceeds, the portions underlying the mask layer are also etched in a direction parallel to the surface of the member to be etched. The unwanted etching of the portions underlying the mask layer is called side etching. The occurrence of such side etching makes it difficult to achieve deep etching at small intervals with high accuracy.

To obviate the problem of side etching, it is general practice in the prior art to carry out etching a plurality of times and to form an etching-resistant layer on the side wall of a side-etched portion of the member to be etched (hereinafter referred to as the side-etched wall surface), thereby preventing further progress of side etching. According to one conventional method, etching is stopped after having proceeded to a predetermined depth and the portion of the mask layer which extends outwardly from the unetched portion of the member over the side etched space, is made molten by heating and brought into contact with the side-etched wall surface, forming therein the etching-resistant layer. With this method, however, when the mask layer is made molten by heating, its extended portion resulting from side etching hangs down under the influence of gravity onto the side-etched wall surface and, at the same time, it is pulled by the cohesive force to the top surface of the member to be etched, so that the etching-resistant layer cannot be formed over the entire area of the side-etched wall surface.

According to another known method of forming the etching-resistant layer on the side-etched wall surface, the member to be etched, after being etched to a predetermined depth, is dipped into a swelling liquid to swell the mask layer whereafter it is dried by heating. In this case, when the swelling liquid remaining on the side-etched wall surface is being evaporated, the extended portion of the mask layer is gradually pulled to the side-etched wall surface by the surface tension acting on the remaining swelling liquid. With this method, the extended portion of the mask layer is bent down into contact with the side-etched wall surface but, in practice, it does not closely contact the side-etched wall surface; in particular, it is difficult to form end portions and corners of a required pattern with high accuracy.

SUMMARY OF THE INVENTION

It is therefore an object of the present invention to provide a chemical etching method which permits highly accurate, deep etching.

Another method of the present invention is to provide a chemical etching method in which an etching-resistant layer can be closely contacted with the entire side-etched wall surface uniformly in the course of etching.

Briefly stated, the chemical etching method of the present invention comprises the steps of forming an etching-resistant layer of a predetermined pattern on the member to be etched; subjecting the member to be etched to chemical etching by using the mask layer as an etching mask; joining to the member to be etched, by an adhesive binder, an extended portion of the mask layer resulting from the so-called side etching accompanying the chemical etching; and subjecting the member to be etched to chemical etching again.

The said adhesive binder is an aqueous solution of glycol and an organic acid. The member to be etched, after being etched to a predetermined depth, is dipped into the adhesive binder solution and then removed therefrom, or sprayed with the adhesive binder solution, whereafter it is dried by heating. As the solvent of the adhesive binder solution remaining on the side-etched wall surface is gradually evaporated, the extended portion of the mask layer is pulled by the surface tension of the remaining adhesive binder solution to the side-etched wall surface and joined thereto.

DESCRIPTION OF THE PREFERRED EMBODIMENTS

Figure 1:
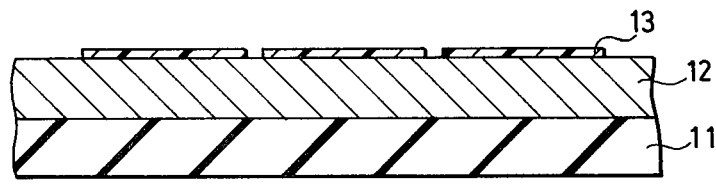
FIGS. 1 and 2 are sectional views showing a conventional chemical etching method.

To facilitate a better understanding of the present invention, a description will be given first of a conventional chemical etching method as used in the manufacture of a printed circuit. As shown in FIG. 1, a conductor layer 12 is formed on the entire top surface of an insulating substrate 11 and an etching-resistant layer or so-called resist layer 13 is formed in a desired pattern on the conductor layer 12. Screen printing or photographic techniques may be employed for the formation of the resist layer 13. The conductor layer 12 is chemically etched through the resist layer 13 used as a mask.

Figure 2:
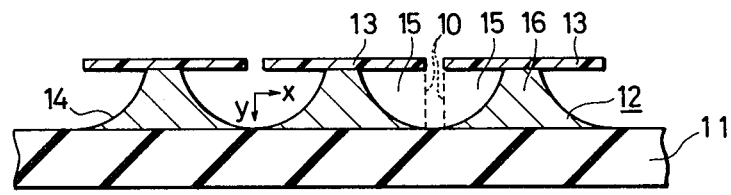

Those portions of the conductor layer 12 which are not masked by the resist layer 13 are etched away not only in a direction perpendicular to the substrate surface, i.e. in the y-direction in FIG. 2, but also in a direction parallel to the substrate surface, i.e. in the x-direction in FIG. 2. The etching in the direction parallel to the substrate surface is commonly referred to as side etching. The rate of side etching is substantially the same as the etching rate in the direction perpendicular to the substrate surface, that is, in the y-direction in FIG. 2. Accordingly, the side walls of the conductor layer 12 etched in both directions become arcuate, concaved in section (in the direction perpendicular to the substrate surface) as indicated by 14.

It is desirable that the conductor layer 12 be etched only in the direction perpendicular to the substrate surface (only in the y-direction) from edges of the pattern formed by the resist layer 13 as indicated by the broken line 10 in FIG. 2, and that the side-etched portion, indicated by 15, that is, the portion surrounded by the resist layer 13, the concave side wall 14 and the broken line 10, be not formed. The presence of such a side-etched portion 15 makes it difficult to reduce the line width and line intervals of a conductor layer pattern 16 formed by the etching, introducing difficulty in the formation of a conductor layer pattern 16 which is fine and of high-density.

Figure 3:
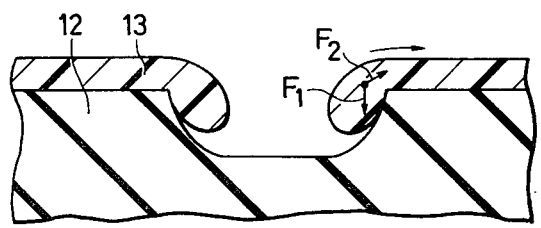
FIG. 3 is an enlarged sectional view showing a conventional method for preventing side etching.

In an effort to solve the problem of side etching, a method has been proposed wherein a thermoplastic material is used for the resist layer 13, the etching operation is interrupted, the resist layer 13 overhanging the side-etched portion 15 is softened by heating to adhere to the concave side wall 14 as shown on an enlarged scale in FIG. 3 and then the etching operation is resumed. With such a method, however, the softened resist layer 13 is subjected to a composite force i.e. a gravity force $F_1$ that tends to bend down the resist layer 13 overhanging the side-etched portion 15, and a force $F_2$ that tends to pull the resist layer 13 upwards the top surface of the conductor layer 12 from the upper portion of the side-etched portion 15 due to the surface tension of the softened resist layer 13 itself. The force $F_2$ is far larger than the force $F_1$ and the resist layer 13 overhanging the side-etched portion 15, when softened by heating, becomes raindrop-shaped as shown in FIG. 3 and, in this state, if the heating temperature is increased or the heating time is extended, the resist layer 13 retreats from the side-etched portion 15. Accordingly, the method described above in respect to FIG. 3 is ineffective, especially when the length of the resist layer overhanging the side-etched portion is short relative to the thickness of the resist layer 13.

Figure 4:
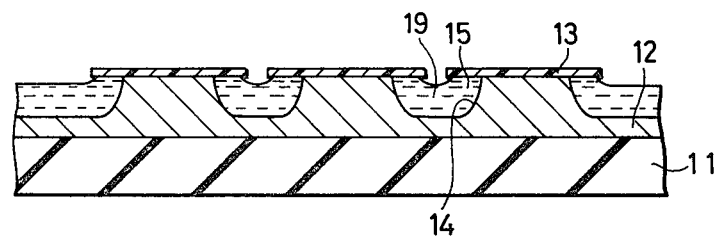
FIGS. 4 to 6 are sectional views showing steps of another conventional method for preventing side etching.
Figure 5:
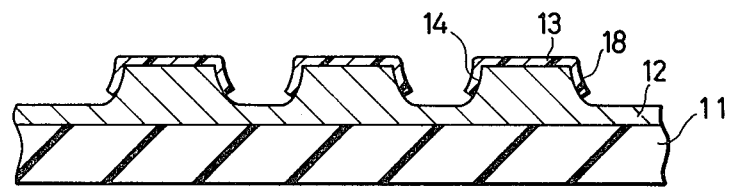
Figure 6:
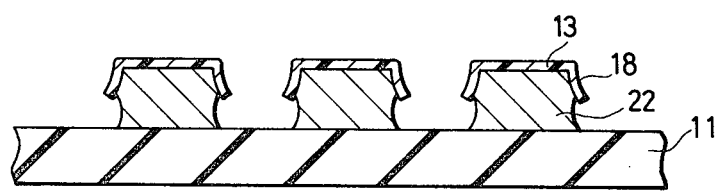

Another method that has been proposed to solve the problem of side etching is shown in FIGS. 4 to 6. At first, the conductor layer 12 is etched by, for example, about two thirds of the thickness of the conductor layer as shown in FIG. 4 and then the mask (resist) layer 13 and the conductor layer 12 are dipped into a swelling liquid, such as a hydrocarbon of the paraffin series, so-called white kerosene, or aromatic hydrocarbon, for example, xylene, toluene or the like, which causes the mask layer 13 to swell. The time for dipping the mask layer 13 and the conductor layer 12 is in the range of several to tens of seconds. The mask layer 13 thus swollen is then dried to be deposited on each side wall 14 of the conductor layer 12, forming an etching-resistant layer 18 as depicted in FIG. 5. More particularly, as the swelling liquid is removed by drying, the swelling liquid 19 remaining in the etched portion including the side-etched portion 15 indicated in FIG. 4 is gradually evaporated and, at that time, the mask layer 13 overhanging the side-etched portion 15 is pulled down and deposited on the side wall 14 of the conductor layer 12 due to the surface tension of the swelling liquid, thus forming the etching-resistant layer 18 as shown in FIG. 5. Thereafter, etching is carried out again to obtain a pattern conductor 22 with less side etching as shown in FIG. 6 than would be the case if the entire conductor layer 12 were etched through a single uninterrupted etching step.

Figure 7:
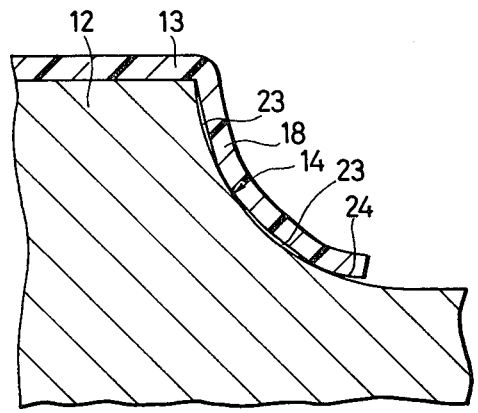
FIG. 7 is an enlarged sectional view showing the state of contact of an etching-resistant layer 18 with a member to be etched in the conventional method shown in FIGS. 4 to 6.
Figure 8A:
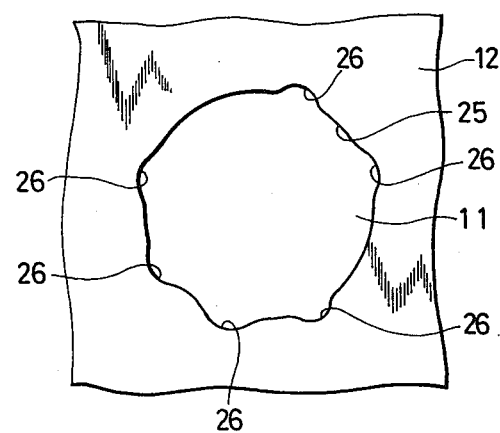
FIGS. 8A and 8B are plan views showing the results of insufficient prevention of side etching in the prior art method.
Figure 8B:
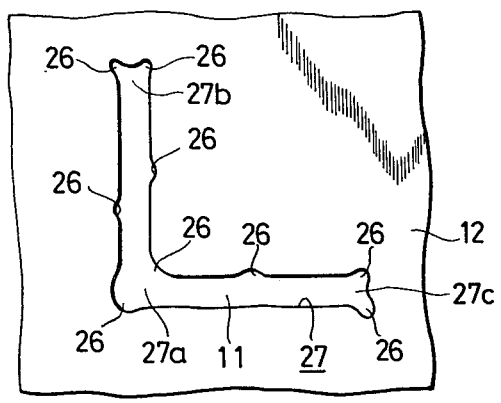

With this conventional method, however, the following defects are encountered. The mask layer 13 bent by swelling and drying, that is, the etching-resistant layer 18, may not closely contact the side wall 14 of the conductor layer 12 at some places and may thereby form gaps 23 and 24 as shown on an enlarged scale in FIG. 7. In such a case, the etchant enters the gaps 23 and 24 to partly etch away the side wall 14 of the conductor layer 12, resulting in enlarged gaps between the conductor layer 12 and the etching-resistant layer 18. For example, in the case of etching the conductor layer 12 to make therein a circular hole 25 as shown in plan view in FIG. 8A, the inner side wall of the conductor layer 12 is recessed at many places as indicated by 26 due to the provision of protection against insufficient side etching as described above. Also in the case of forming an L-shaped groove 27 in the conductor layer 12 by etching as depicted in FIG. 8B, the recesses 26 are similarly formed at random due to insufficient prevention of side etching. Especially in this latter case, insufficient prevention of side etching usually occurs at the corner 27a of the groove 27 and at the corners of both end portions 27b and 27c.

Figure 8C:
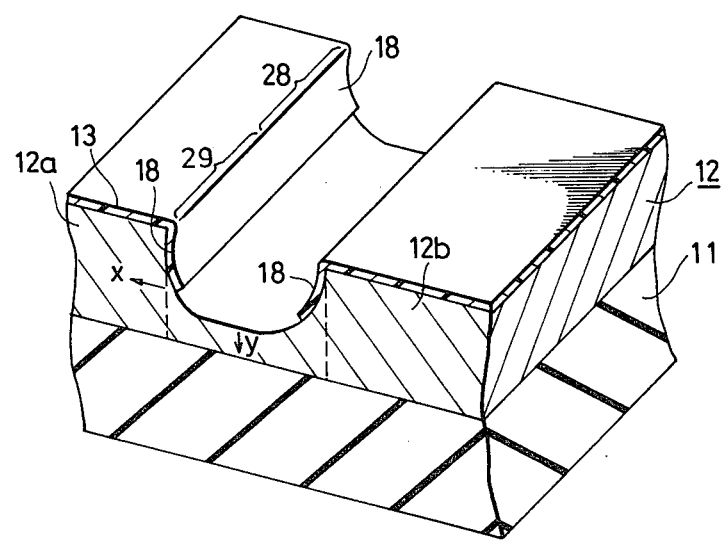
FIG. 8C is a perspective view explanatory of the defect of the conventional method.

Such insufficient prevention of side etching in this method leads to an increase in the electric resistance value of the thin conductor lead that is obtained by etching. That is, where a bad contact portion 29 and a good contact portion 28 are both present between the etching-resistant layer 18 on the side walls of conductor leads 12a and 12b to be formed by etching, for instance, as shown in FIG. 8C, etching also takes place in the x-direction or the widthwise direction of the conductor lead 12a in the bad contact portion 29. On the other hand, since the same amount of etchant is supplied to the good contact portion 28 and the bad contact portion 29, the etching rate in the y-direction or the thickwise direction of the conductor lead in the bad contact portion is lower than the etching rate in the good contact portion 28. For example, to produce a spiral coil by means of etching, it is necessary that the conductor layer be etched down to the insulator substrate 11 to completely separate adjacent conductor leads of the coil. Accordingly, After the conductor layer in the bad contact portion 29 is etched down to the insulator substrate 11, then the conductor layer portion below the good contact portion 28 is excessively side-etched away. As a result of this, the conductor lead in the good contact portion 28 becomes smaller in line width than a predetermined value; namely, the conductor lead is reduced in line width at many places, providing for increased electric resistance in the coil.

The reason that the prior art method is accompanied by the abovementioned drawback is as follows: The mask layer 13 is usually formed of a material consisting principally of polyvinyl alcohol and is subjected to what is called a film hardening treatment so as to make the layer 13 resistant to water and the etchant. By this treatment, remaining OH groups in the polyvinyl alcohol are significantly reduced to provide the layer 13 with the water-resisting and the etchant-resisting property. The mask layer 13 subjected to such treatment is not readily swollen by a solvent and even if bent by the surface tension of the swelling liquid, it is difficult for the mask layer to closely contact the side wall of the side-etched portion. Furthermore, since the swelling liquid has no adhesion, the mask layer in contact with the side wall of the side-etched portion peels off therefrom over an appreciable area after the swelling liquid is dried and the portion still remaining on the side wall also peels off therefrom as soon as it is engaged by the etchant.

Next, a detailed description will be given of the chemical etching method of the present invention.

According to the present invention, the etching-resistant mask layer overhanging the side-etched portion formed in the course of etching is bonded to the side wall of the member being etched through the use of an adhesive binder, after which etching is carried out again.

At first, an etching-resistant photoresist layer, for example, is formed over the entire area of the top surface of the member to be etched and is exposed to irradiation by light to develop a desired pattern, forming on the member to be etched an etching-resistant mask layer of the pattern (or its inverted pattern). The etching-resistant mask layer may also be formed by screen printing or like techniques. Then the member to be etched is subjected to a first etching step. The etching depth in this first step is more than a half, preferably about two thirds of the overall etching depth. Then the member is immersed in an adhesive binder solution after being rinsed with water as required. The adhesive binder solution may preferably be an aqueous solution; for example, a 0.2 to 1% aqueous solution of glycol and an organic acid is used. In this case, good results can also be obtained by using a solution in which a portion of water of the abovesaid aqueous solution is replaced with a water-soluble organic solvent, such as methyl alcohol, ethyl alcohol, acetone or the like; that is, a solution in which glycol and an organic solvent are added as adhesive to a mixture of water and a water-soluble organic solvent. Incidentally, a solution of an organic solvent of adhesive also produces good results but, in the case of using it in large quantities, there is a danger of explosion.

As the adhesive binder solution, the aqueous solution of glycol and an organic acid can be used as mentioned above. As the glycol, use can be made of ethylene glycol, propylene glycol, butanediol, diethyleneglycol, dipropyleneglycol, triethyleneglycol, pentanediol, hexanediol, 2.2-4 trimethyl pentanediol, bisphenol A hydride, glycerine, trimethylene glycol, 2 ethyl-1.3-hexanediol and so forth. As the organic acid, use can be made of maleic acid, fumaric acid, citraconic acid, itaconic acid, tetrachlorophthalic anhydride, hexachloro-endomethylene-tetrahydro-phthalic acid, tetrabromophthalic anhydride, phthalic acid, endomethylene tetrahydrophthalic anhydride, succinic acid, adipic acid, azelaic acid, sebacic acid and so forth.

Figure 9:
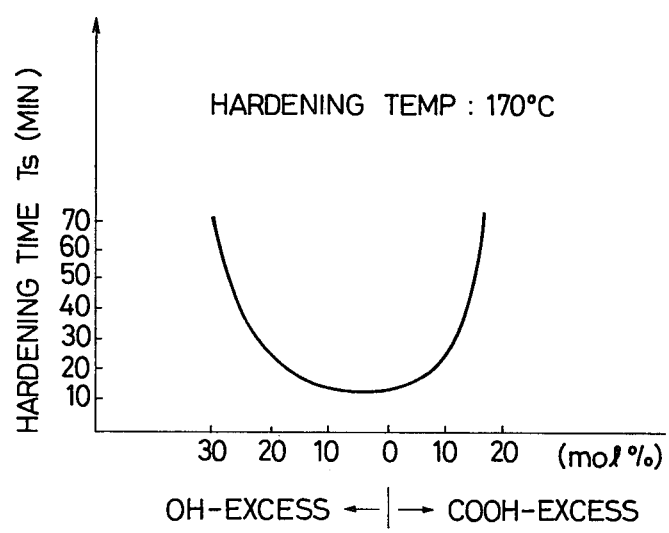
FIG. 9 is a graph showing the relationship of the ratio between the OH group (the hydroxyl group) of glycol and the COOH group (the carboxyl group) of an organic acid to the time for hardening an adhesive binder.

The blending ratio of the glycol and the organic acid is such that the total number of OH groups of the former and the COOH groups of the latter are substantially equal to each other. An appropriate range of this blending ratio is from a 20 mol% excess of the OH group to a 10 mol% excess of the COOH group. The blending ratio of the adhesive binder solution outside this range retards hardening of the adhesive binder, and hence is impractical. FIG. 9 shows the relationship between the adhesive binder hardening time Ts necessary for providing sufficient etching-resistant property at a hardening temperature of 170° C. and the blending ratio of the glycol and the organic acid. In FIG. 9, the left-hand side of 0 (%) on the abscissa shows an excess of the OH group in mol% and the right-hand side an excess of the COOH group in mol%. It will be appreciated from FIG. 9 that a more preferred blending ratio capable of achieving a hardening time Ts under 15 or 16 minutes, is between a 10 mol% excess of the OH group and a 5 mol% excess of the COOH group.

Next, a description will be given of specific examples of the solution of the glycol and the organic acid.

| Example 1 | |
|---|---|
| Glycerine | 0.24% |
| Maleic acid | 0.238% |
| Fumaric acid | 0.238% |
| Acrylic acid | 0.133% |
| Water | 99.15% |
| Example 2 | |
| Glycerine | 0.34% |
| Maleic acid | 0.238% |
| Fumaric acid | 0.238% |
| Acrylic acid | 0.133% |
| Water | 60% |
| Dioxane | 39.15% |

The adhesive binder herein mentioned includes precursors of an adhesive binder that form an adhesive binder upon chemical reaction. The mixture of the glycol and the organic acid is an example.

An adhesive binder other than the mixture of the glycol and the organic acid is a mixture of an epoxy compound (of small molecular weight, in particular) and the organic acid which can be evaporated by heating.

Figure 10:
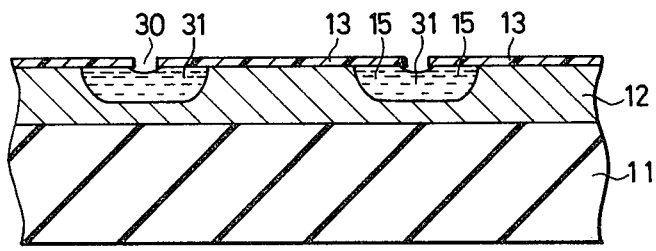
FIGS. 10 to 12 are sectional views illustrating principal steps involved in the chemical etching method of the present invention.

The member etched to the aforementioned depth is dipped into the adhesive binder solution and then heated to evaporate the solvent, which causes the mask layer overhanging the side-etched portion (resulting from the first etching step) to be bonded to the etched member. That is, as shown in FIG. 10, the mask layer 13 is formed on the member 12 to be etched and is subjected to the first etching step. The first etching step may be effected by either the spray or the dip method.

After the first etching step, the etched member is washed with water or cleaning solution and dried as required, and is thereafter dipped into or sprayed with the adhesive binder solution so that the etched member is sufficiently covered over its entire area with the adhesive binder solution. More particularly, the etched member is dipped into or sprayed with the adhesive binder solution so that it may fill each groove 30 formed by the first etching step and the side-etched portion 15 forming a part of the groove 30 as indicated by 31 in FIG. 10.

Figure 11:
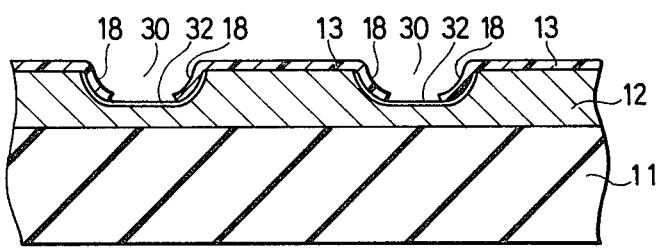
Figure 12:
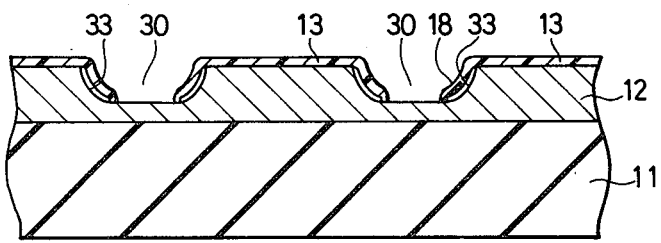

Then the etched member 12 is dried by heating to form thereon a thin film of the adhesive binder on the inner wall of the groove 30 as indicated by 32 in FIG. 11. That is, as the amount of the solvent decreases by evaporation, the mask layer 13 overhanging the side-etched portion 15 is gradually bent down by the surface tension of the adhesive binder solution, to the side wall of the groove 30 of the etched member 12 and the etching-resisting layer 18 is deposited on the inner surface of the groove 30. At this time the adhesive binder film 32, which is a mixture of the glycol and the organic acid, is still sticky and soft. Further heating causes evaporation of both the glycol and the organic acid, or at least one of them, from the portion of the binder film 32 which is exposed to the air before a hardening reaction (i.e. esterification of the organic acid) between the glycol and the organic acid takes place. Therefore, even in the latter case, the remainder on this area is easily washed off as shown in FIG. 12 when a second etching step is carried out. On the other hand, at the portion 33 of the binder film 32 that is covered with the resist layer 18, both the glycol and the organic acid are prevented by the resist layer 18 from evaporating during the aforesaid heating, thus allowing the reaction between the glycol and the organic acid to form an ester film as a rigid second etching-resistant layer 33 shown in FIG. 12, which firmly joins the first etching-resistant layer 18 to the etched side wall of the member 12. In the case of using the glycol and the organic acid, good results were obtained when the heating was conducted at 100° to 180° C. for 8 to 25 minutes. Next, a second etching step is carried out down to the insulator substrate 11 as shown in FIG. 13.

Figure 14:
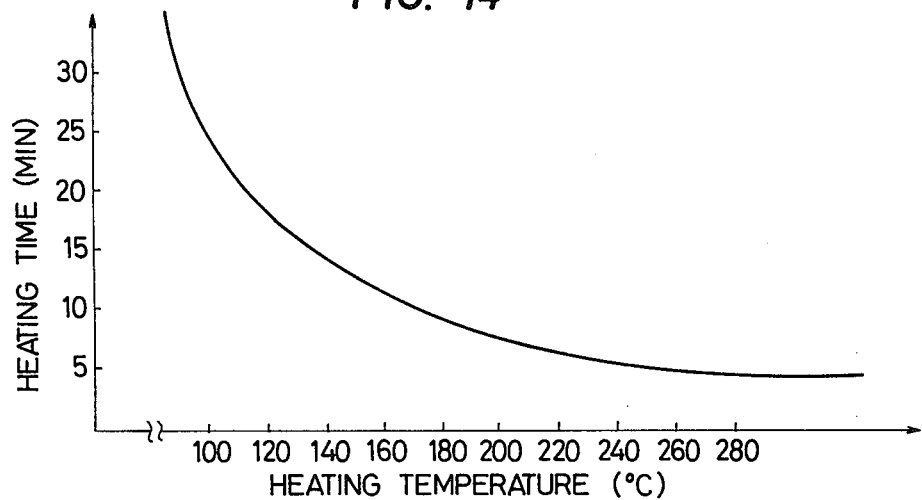
FIG. 14 is a graph showing an example of the relationship between the heating temperature and the heating time employed for joining an etching-resistant layer to the side-etched wall surface.

It is preferred in terms of productivity that the time for heating described above in respect of FIGS. 11 and 12 be short; in view of this, it is preferable to increase the heating temperature. An appropriate heating temperature is one which is high within the range of the heat-resisting temperature of both the member 12 to be etched and the mask layer 13. FIG. 14 shows the relationship between the heating temperature and the heating time for hardening the adhesive binder to form a second etching-resistant layer 33 having sufficient etching resistance, where copper and one of the polyvinyl alcohol series are used as the member 12 to be etched and the mask layer 13, respectively, and the solution of Example 2 and an aqueous solution of ferric chloride are used as the adhesive binder solution and the etchant, respectively. The higher the heating temperature is, the shorter the heating time becomes. With a heating temperature above 240° C., however, the heating time is not appreciably reduced. When the mask layer 13 is formed of a material of the polyvinyl alcohol series, the heating temperature can be raised to about 400° C. A heating temperature below 50° C. requires a markedly extended heating time, and hence is not suitable for practical use.

Figure 15:
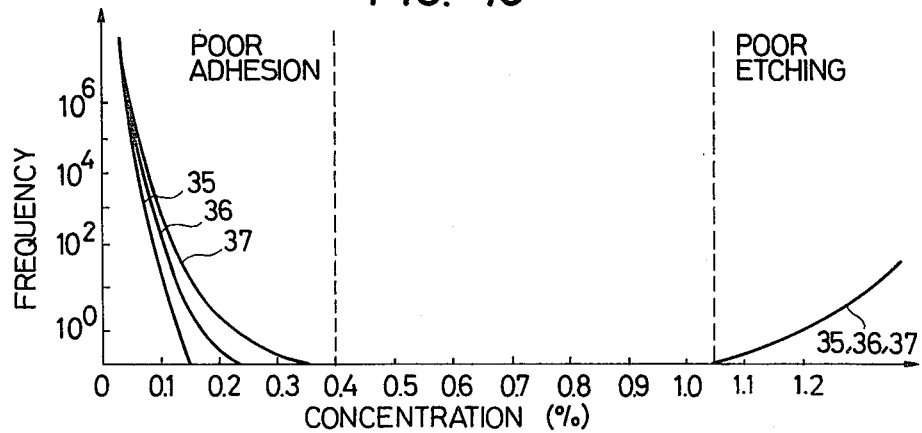
FIG. 15 is a graph showing the relationship between the concentration of the adhesive binder and the frequency of occurrence of bad etching, with the thickness of a mask layer 13 used as a parameter.

FIG. 15 shows the relationship between the concentration of the sum amount of the glycol and the organic acid to the adhesive binder solution in weight % and the frequency of occurrence of bad etching. The frequency of occurrence is defined as the number of bad etching portions that occur along an etched line of 100 m length. Etching is evaluated as being practically acceptable when the number of bad etching portions is one or less per 100 m. The conditions used are the same as those in the case of FIG. 14. The heating temperature for drying was 260° C. and the heating time was 15 minutes. In FIG. 15, curves 35, 36 and 37 indicate the cases where the thickness of the mask layer 13 is 0.5, 2.0 and 10.0 $\mu$m, respectively. It will be seen from FIG. 15 that when the concentration of the solutes, i.e. the adhesive binder components, is too low, the etching-resistant layer does not closely contact the side wall of the side-etched portion, and that the thicker the mask layer 13, the lower the concentration of the adhesive binder which may be used. When the concentration of the adhesive binder solution exceeds 1.1%, insufficient etching develops regardless of the thickness of the mask layer 13. This results from insufficient evaporation of the adhesive binder components, i.e. the glycol and the organic acid during the heating because of its too high concentration. It will be appreciated from the above that the concentration of the solutes should be between 0.15% and 1.05%, but it is preferable to select the concentration of the solutes in the range of 0.4 to 1.0% regardless of the thickness of the mask layer 13.

Figure 13:
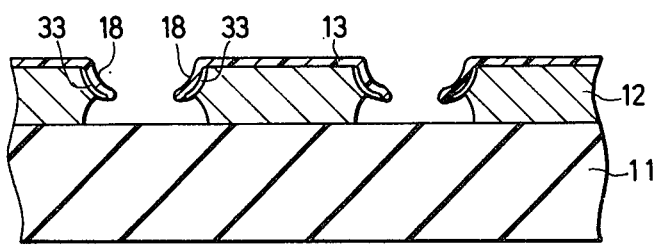
FIG. 13 is a sectional view illustrating a step following the step shown in FIG. 12.

A ridged portion formed as a boundary between the side-etched walls formed by the first and second etchings may locate substantially at the middle of the thickness of the member 12 as shown in FIG. 13 when the first etching step is carried out to the depth of about two thirds the thickness. In this case, the shapes of the side-etched walls formed by the first and second etchings may become substantially symmetrical to each other in respect of the ridged portion.

The etchant for use in the present invention need not always be limited specifically to the ferric chloride aqueous solution but may also be those consisting principally of cupric salt, HCl, $H_2SO_4$, $HNO_3$, NaOH and KOH, respectively. In the foregoing, etching is temporarily stopped once and the etching-resistant layer 18 is formed and then etching is carried out again, but it is also possible to repeat such a step a plurality of times before a required etching depth is obtained.

According to the chemical etching method of the present invention, after being etched to a certain etching depth, the member to be etched is dipped into the adhesive binder solution and pulled out therefrom and then dried by heating, which causes the mask layer overhanging the side-etched portion is to be bent down into close contact with the side wall of the side-etched portion, forming thereon the etching-resistant layer 18. As a result of this, when the member to be etched is etched again, the etchant is prevented from entering between the etching-resisting layer 18 and the member being etched, ensuring that a pattern of a required shape is produced without permitting the etching-resisting layer 18 to peel off the side wall of the side-etched portion especially at end portions and corners of the pattern. Accordingly, by the application of the present invention, for instance, to the fabrication of a sheet coil for a miniature motor, it is possible to obtain a sheet coil in which the coil conductor lead is equal in width throughout and the thickness of the conductor lead is larger than the space between adjacent leads.

It will be apparent that many modifications and variations may be effected without departing from the scope of the novel concepts of the present invention.

What is claimed is:

1. A chemical etching method comprising the steps of:
    forming an etching-resistant mask, having a predetermined pattern, on the surface of a metal member to be etched;
    subjecting said metal member to a first chemical etching step through said mask;
    joining those portions of said mask which overhang side-etched portions of said metal member, following said first etching step, to the side walls of the said side-etched portions thereby to form a first etching-resistant layer on said side walls, said joining step comprising applying an adhesive binder solution to parts of said metal member including said side walls and thereafter heating said metal member to dry said adhesive binder solution, the said overhanging portions of said mask being bent down by the surface tension of the adhesive binder solution at the corner between the overhanging portions of said mask and the side walls of said side-etched portions as the adhesive binder solution is dried, the adhesive binder between said first etching-resistant layer and said side walls of said side-etched portions thereafter being hardened to form a second etching-resistant layer which joins said first layer to said side walls; and
    thereafter subjecting said metal member to a second chemical etching step through said mask and said etching-resistant layers.

2. A chemical etching method according to claim 1 wherein said step of applying adhesive binder solution comprises dipping said metal member into the adhesive binder solution.

3. A chemical etching method according to claim 1 wherein said step of applying adhesive binder solution comprises spraying the adhesive binder solution onto said metal member.

4. A chemical etching method according to claim 1 wherein said step of applying adhesive binder solution is preceded by a washing step for washing away etchant used in said first etching step.

5. A chemical etching method according to claim 4 including the step of heating said member following said washing step and before said adhesive binder solution applying step, to dry the cleaning solution used in said washing step.

6. A chemical etching method according to claim 1 wherein the adhesive binder solution is an aqueous solution of glycol and an organic acid.

7. A chemical etching method according to claim 6 wherein the blending ratio of the glycol and the organic acid is in the range from a 15 mol% excess of the total number of OH groups of the glycol to a 10 mol% excess of the total number of COOH groups of the organic acid.

8. A chemical etching method according to claim 7 wherein the total number of the OH groups of the glycol and the total number of the COOH groups of the organic acid are substantially equal to each other.

9. A chemical etching method according to claim 1 wherein the concentration of the adhesive binder components to the adhesive binder solution is in the range of from 0.15 to 1.05% by weight.

10. A chemical etching method according to claim 1 wherein the concentration of the adhesive binder components to the adhesive binder solution is in the range of from 0.4 to 1.0% by weight.

11. A chemical etching method according to claim 1 wherein said first etching step, said joining step and said second etching step are repeated at least once in sequential order.

12. A chemical etching method according to claim 1 wherein said first etching step is carried out until the etching depth reaches about two thirds the thickness of said metal member to be etched.

* * * * *